US012713821B2

(12) United States Patent
Li et al.

(10) Patent No.: US 12,713,821 B2
(45) Date of Patent: Aug. 18, 2026

(54) DISPLAY PANEL AND DISPLAY DEVICE

(71) Applicant: HKC CORPORATION LIMITED, Shenzhen (CN)

(72) Inventors: Yao Li, Shenzhen (CN); Tianjun Huang, Shenzhen (CN); Zhonglin Cao, Shenzhen (CN); Chuan Wu, Shenzhen (CN); Wenyu Yi, Shenzhen (CN); Yajuan Feng, Shenzhen (CN); Dongmei Wei, Shenzhen (CN); Jie Chen, Shenzhen (CN); Lidan Ye, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 342 days.

(21) Appl. No.: 18/639,968

(22) Filed: Apr. 19, 2024

(65) Prior Publication Data

US 2025/0008828 A1 Jan. 2, 2025

(30) Foreign Application Priority Data

Jun. 29, 2023 (CN) ......................... 202310792287.5

(51) Int. Cl.

| | |
|---|---|
| ***H10K 59/80*** | (2023.01) |
| ***H10K 59/38*** | (2023.01) |
| ***H10K 59/40*** | (2023.01) |

(52) U.S. Cl.
CPC ......... *H10K 59/8792* (2023.02); *H10K 59/38* (2023.02); *H10K 59/40* (2023.02)

(58) Field of Classification Search
CPC ........................... H10K 59/8792; H10K 59/38
See application file for complete search history.

(56) References Cited

U.S. PATENT DOCUMENTS

2023/0083612 A1* 3/2023 Song .................... H10K 59/122 257/618

* cited by examiner

*Primary Examiner* — Matthew L Reames

(57) ABSTRACT

This application discloses a display panel and a display device. There is a fingerprint recognition region in the display area. A fingerprint recognition element is disposed in the display panel correspondingly below the fingerprint recognition region. The display panel includes an organic light-emitting layer and a color filter layer arranged on a light-emitting side of the light-emitting layer. The color filter layer includes a first black matrix and a color filter. The first black matrix is disposed corresponding to the fingerprint recognition region. Adjacent color filters are separated by the first black matrix. The first black matrix includes carbon black filaments, which are in the shape of elongated strips. Each carbon black filament has a length that lies in the range of 100 nm to 1000 nm and a diameter range that lies in the range of 1 nm to 100 nm.

18 Claims, 3 Drawing Sheets

DISPLAY PANEL AND DISPLAY DEVICE

CROSS-REFERENCE TO RELATED APPLICATIONS

This application claims the priority and benefit of Chinese patent application number 202310792287.5, titled "Display Panel and Display Device" and filed Jun. 29, 2023 with China National Intellectual Property Administration, the entire contents of which are incorporated herein by reference.

TECHNICAL FIELD

This application relates to the field of display technology, and in particular, to a display panel and a display device.

BACKGROUND

The description provided in this section is intended for the mere purpose of providing background information related to the present application but doesn't necessarily constitute prior art.

With the continuous development of OLED (Organic Light-Emitting Diode) display technology, OLED is increasingly used in displays such as smartphones, tablets, computers, and TVs. OLED displays have the advantages of thin and light, high contrast, fast response, wide viewing angle, high brightness, full color, etc. In order to prevent the reflection of the screen, OLED devices may need to use a circular polarizer, but the circular polarizer causes too much light loss. A new technology that replaces polarizers, represented by COE (Color film on Encapsulation), has emerged. The transmittance of the color filter can reach a maximum of 60%, which can greatly increase the brightness of the passing light, thereby reducing the power consumption of the OLED device and extending its service life. Through the Color Filter process, R, G, and B color filters are deposited. In order to prevent color cross-talk between different colors, a black matrix (BM) is set up between different color filters to absorb the colored light at the edges of the color filters. These color filters are therefore separated by a black matrix (BM).

Currently, under-screen fingerprint recognition technologies include capacitive fingerprint recognition, under-screen optical fingerprint recognition, ultrasonic fingerprint recognition, etc. Among them, the ultrasonic technology has the most accurate recognition capabilities. Ultrasonic under-screen fingerprint recognition technology is based on ultrasonic waves. A sensor first emits ultrasonic waves to the surface of the finger through the screen and receives an echo, thereby constructing a 3D image for recognition. After the ultrasonic wave is scattered and partially refracted inside the COE, the wave intensity is lost, and the wave intensity reaching the finger for recognition will be weakened. Therefore, it becomes an urgent problem that needs to be solved by those having skill in the art.

SUMMARY

In view of the above, it is a purpose of this application to provide a display panel and a display device to reduce the propagation loss of ultrasonic waves in the COE display panel, thereby increasing the accuracy of fingerprint recognition.

This application discloses a display panel, which includes a display area. A fingerprint recognition region is disposed in the display area. A fingerprint recognition element is disposed in the display panel correspondingly below the fingerprint recognition region. The display panel includes a light-emitting element and a color filter layer. The color filter layer is arranged on a light-emitting side of the light-emitting element. The color filter layer includes a first black matrix and a color filter. The first black matrix is set corresponding to the fingerprint recognition region. Adjacent color filters are separated by the first black matrix. The first black matrix includes carbon black filaments. The carbon black filaments are in the shape of elongated strips. The length of the carbon black filament ranges from 100 nm to 1000 nm, and the diameter ranges from 1 nm to 100 nm.

In some embodiments, the plurality of carbon black filaments have an equal size.

In some embodiments, the carbon black filament includes a first end and a second end in a length orientation, and the first ends of the plurality of carbon black filaments face the same direction.

In some embodiments, a planarization layer is disposed on the color filter layer. The thickness of the planarization layer corresponding to the first black matrix is smaller than the thickness of the planarization layer corresponding to the second black matrix. The thickness of the first black matrix is greater than or equal to the thickness of the second black matrix.

In some embodiments, the first black matrix includes a plurality of protruding structures or pit structures. The plurality of the protruding structures or the plurality of pit structures have the same shape and size. The plurality of the protruding structures or the plurality of pit structures are arranged in an array at predetermined intervals. A radial width of the protruding structure or the pit structure ranges from 1 mm to 10 mm.

In some embodiments, the first black matrix includes multiple protruding structures. A planarization layer is disposed on the color filter layer. The thickness of the raised structure is equal to 30% to 60% of the thickness of the planarization layer.

In some embodiments, the fingerprint recognition element includes a piezoelectric material layer correspondingly arranged below the first black matrix. Furthermore, the piezoelectric material layer includes convex portions corresponding to the protruding structures of the first black matrix. The convex portions are arranged in one-to-one correspondence with the protruding structures.

In some embodiments, the length orientation of the plurality of carbon black filaments is consistent with the length orientation of the first black matrix.

In some embodiments, the color filter layer further includes a second black matrix. The second black matrix includes carbon black particles. The carbon black particles arranged in the first black matrix are arranged in a different order than the carbon black particles arranged in the second black matrix. The acoustic impedance of the first black matrix to ultrasonic waves is lower than the acoustic impedance of the second black matrix to ultrasonic waves.

This application further discloses a display device, including a driving circuit and the above-mentioned display panel, wherein the driving circuit is used to drive the display panel to display.

In this application, the shape of the carbon black particles in the first black matrix is improved and set as an elongated carbon black filament with a length ranging from 100 nm to 1000 nm and a diameter ranging from 1 nm to 100 nm. When the ultrasonic wave passes through the first black matrix 171, the scattering and refraction interfaces can be effectively reduced, and at the same time, the variation range of the scattering and refraction angles is smaller so that and there is less interference with the normal propagation of longitudinal waves. Accordingly, the loss of ultrasonic waves after passing through the first black matrix will also be effectively reduced, thereby reducing the wave intensity loss after scattering and refraction of ultrasonic waves in the fingerprint recognition region, increasing the accuracy of fingerprint recognition.

BRIEF DESCRIPTION OF DRAWINGS

The accompanying drawings are used to provide a further understanding of the embodiments according to this application, and constitute a part of the specification. They are used to illustrate the embodiments according to this application, and explain the principle of this application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

Figure 1:
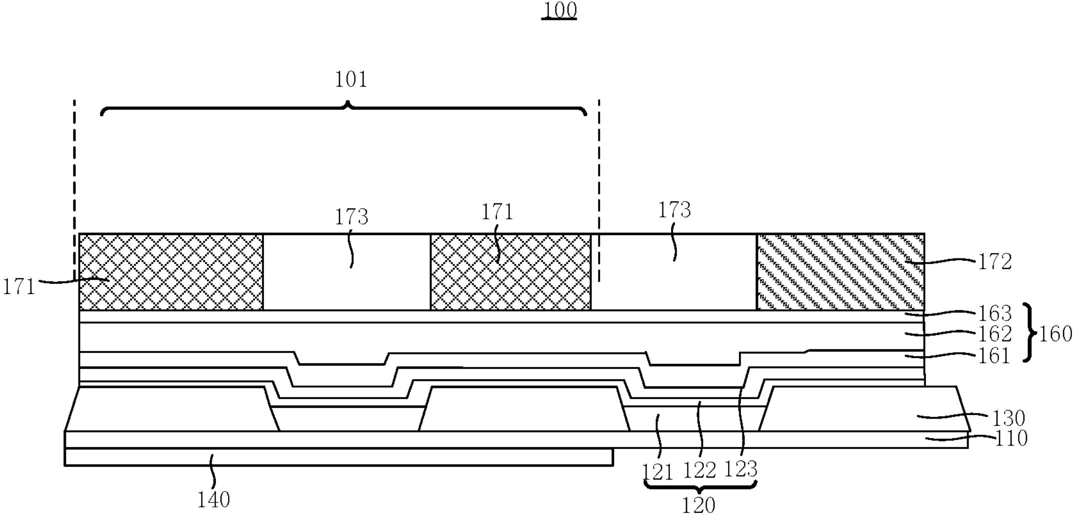
FIG. 1 is a schematic diagram of a first display panel according to the present application.

In the figure: 100. Display panel; 101. Fingerprint recognition region; 110. Substrate; 120. Light-emitting element; 121. Bottom electrode; 122. Light-emitting layer; 123. Top electrode; 130. Pixel defining layer; 140. Fingerprint recognition element; 141. Piezoelectric material layer; 142. Convex portion; 160. Encapsulation layer; 161. First inorganic layer; 162. First organic layer; 163. Second inorganic layer; 170. Color filter layer; 171. First Black matrix; 172. Second black matrix; 173. Color filter; 174. Carbon black filament; 175. Protruding structure; 176. Pit structure; 180. Planarization layer; 200. Display device; 210. Driving circuit.

DETAILED DESCRIPTION OF EMBODIMENTS

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

As used herein, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. Terms "multiple", "a plurality of", and the like mean two or more. In addition, terms "up", "down", "left", "right", "vertical", and "horizontal", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure. For those of ordinary skill in the art, the specific meanings of the above terms as used in this application can be understood depending on specific contexts.

Hereinafter this application will be described in further detail with reference to the accompanying drawings and some optional embodiments.

FIG. 1 is a schematic diagram of a first display panel according to this application. Referring to FIG. 1, this application discloses a display panel. The display panel 100 includes a display area. A fingerprint recognition region 101 is disposed in the display area. A fingerprint recognition element 140 is disposed in the display panel 100 correspondingly below the fingerprint recognition region 101. The display panel 100 includes a light-emitting element 120 and a color filter layer 170. The color filter layer 170 is disposed on a light-emitting side of the light-emitting element 120. The color filter layer 170 includes a first black matrix 171 and a color filter 173. The first black matrix 171 is disposed corresponding to the fingerprint recognition region 101. Adjacent color filters 173 are separated by the first black matrix 171. The first black matrix 171 includes carbon black filaments. The carbon black filaments are in the shape of elongated strips. The length of each carbon black filament ranges from 100 nm to 1000 nm, and its diameter ranges from 1 nm to 100 nm.

In this application, the shape of the carbon black particles in the first black matrix 171 is improved and set as an elongated carbon black filament with a length ranging from 100 nm to 1000 nm and a diameter ranging from 1 nm to 100 nm. When the ultrasonic wave passes through the first black matrix 171, the scattering and refraction interfaces can be effectively reduced, and at the same time, the variation range of the scattering and refraction angles is smaller so that and there is less interference with the normal propagation of longitudinal waves. Accordingly, the loss of ultrasonic waves after passing through the first black matrix will also be effectively reduced. Therefore, the wave intensity loss of the ultrasonic waves after scattering and refraction in the fingerprint recognition region is reduced, thereby increasing the accuracy of fingerprint recognition.

Ultrasonic waves are mechanical waves that can propagate in gases, liquids and solids. In other words, ultrasonic waves can propagate in any medium with elastic properties. As the sound source, medium, and boundary conditions etc. are different, the wave types of the propagated ultrasonic waves are also different, such as longitudinal waves, transverse waves, surface waves, etc. When ultrasonic waves propagate in a medium, the wave in which the vibration direction of the medium particles is parallel to the wave propagation direction is called a longitudinal wave. When a transverse wave propagates in a medium, the direction of vibration of the medium particles is perpendicular to the propagation direction of the wave. When sound waves propagate in a medium, the sound waves whose energy is concentrated near the free surface layer of the medium or near the interface between two media are called surface waves. When ultrasonic waves propagate in different media, they will be scattered and refracted to varying degrees on the surface of the medium. At the same time, the propagation ability of ultrasonic waves in solid, liquid, and gas sequentially gradually weakens.

After natural light (white light) passes through the color filter layer 170, only the light of the corresponding colors is transmitted, and the light in other wavelength bands will be absorbed by the color filter layer 170. In order to meet the needs of light transmission in the OLED display panel 100, the anode and cathode materials may need to have total reflection and transflective properties respectively. Therefore, the natural light passing through the light-emitting layer in the light-emitting element 120 and the light produced by the OLED's self-illumination will be totally reflected by the anode. In particular, when the light-emitting element 120 does not emit light, external ambient light enters the panel. Because the ambient light may include the entire visible light band or a wide spectrum band, the color filter 173 may filter out most of the wavelength bands of the ambient light. After natural light (white light) passes through the color filter 173, only the light of the corresponding color is transmitted, and the light in other wavelength bands will be absorbed by the color filter 173. For example, the red filter may only transmit red light. After the red light enters the light-emitting element 120, since the metal electrode has a relatively high reflectivity, the red light is reflected and emitted from the red filter or from other pixel positions, causing glare. In order to prevent color cross-talk between different colors of light, a black matrix (BM) may be set up between different color filters to absorb the colored light at the edges of the color filters and the natural light in the non-pixel opening area of the environment. These color films of different colors will be separated from each other by a black matrix However, due to its light-absorbing functionality, in addition to some necessary organic solvents and dispersants, carbon black particles are the main component of the black matrix that gives it black light-absorbing properties. For the time being, taking ordinary black matrix as an example, the distribution of carbon black particles in the black matrix is disorderly, and the particle sizes and lengths are also non-uniform. For ultrasonic fingerprint recognition, after ultrasonic waves enter the black matrix, due to the disordered distribution of carbon black particles, the ultrasonic waves will continue to pass through different medium surfaces during propagation, resulting in refraction and scattering at different angles. These refracted and scattered ultrasonic waves cannot continue to propagate along the direction of the original longitudinal wave, so that the ultrasonic wave loss after passing through the black matrix is relatively large.

Ultrasonic under-screen fingerprint recognition technology is based on ultrasonic waves. An ultrasonic sensor first emits ultrasonic waves to the surface of the finger. When the finger reflects the ultrasonic wave, an ultrasonic receiver receives the echo. The principle consists in using the density difference between the skin on the surface of the fingerprint and the air to construct a 3D image, and then comparing it with the information that already exists on the terminal to achieve the purpose of identifying the fingerprint. The advantage of ultrasonic under-screen fingerprint recognition is that it has relatively strong penetration and strong resistance to stains. Even wet and dirty fingers can still be perfectly identified. In addition, relying on the excellent penetration of ultrasound, it also supports living body detection. Because it can obtain 3D fingerprint recognition images, the security is comparatively higher than other under-screen fingerprint recognition solutions.

In the under-screen ultrasonic fingerprint recognition system based on the COE structure, an under-screen ultrasonic transmitter emits ultrasonic waves, which after passing through the COE structure reach the finger fingerprint area. After the ultrasonic waves are reflected again, a reflected signal is received by the transmitter for signal processing and conversion. The specific process of fingerprint recognition is as follows. The driving electrode receives an electrical signal and excites the piezoelectric material to deform and emit ultrasonic waves; after the ultrasonic waves are transmitted to the valleys and ridges of the finger, the reflected ultrasonic signals have different intensities; the reflected ultrasonic waves excite the piezoelectric material again to convert the mechanical signal into an electrical signal, which is sensed by the switching device layer and then imaged for fingerprint recognition.

In this embodiment, the first black matrix may be formed in the display area. The first black matrix including the carbon black filaments also has a satisfactory functionality in absorbing light.

In another embodiment of this application, the first black matrix is formed only in the fingerprint recognition region, and a typical black matrix may be disposed in the non-fingerprint recognition region. Specifically, the color filter layer 170 includes a first black matrix 171, a second black matrix 172, and a color filter 173. The first black matrix 171 is arranged corresponding to the fingerprint recognition region 101. The adjacent color filters 173 are separated by the first black matrix 171 or the second black matrix 172. The first black matrix 171 and the second black matrix 172 each include carbon black particles. The carbon black particles arranged in the first black matrix 171 are arranged in a different order than the carbon black particles arranged in the second black matrix 172. The acoustic impedance of the first black matrix 171 to ultrasonic waves is lower than the acoustic impedance of the second black matrix 172 to ultrasonic waves.

In this application, the shape of the carbon black particles in the first black matrix 171 is improved and set as an elongated carbon black filament with a length ranging from 100 nm to 1000 nm and a diameter ranging from 1 nm to 100 nm. When the ultrasonic wave passes through the first black matrix 171, the scattering and refraction interfaces can be effectively reduced, and at the same time, the variation range of the scattering and refraction angles is smaller so that and there is less interference with the normal propagation of longitudinal waves. Accordingly, the loss of ultrasonic waves after passing through the first black matrix will also be effectively reduced. Thus, the acoustic impedance of the first black matrix 171 to ultrasonic waves is lower than the acoustic impedance of the second black matrix 172 to ultrasonic waves, so that in the fingerprint recognition region 101, the loss caused by the first black matrix 171 to ultrasonic waves is lower, reducing the wave intensity loss after scattering and refraction of the ultrasonic waves in the fingerprint recognition region 101, thereby increasing the accuracy of fingerprint recognition.

Figure 2:
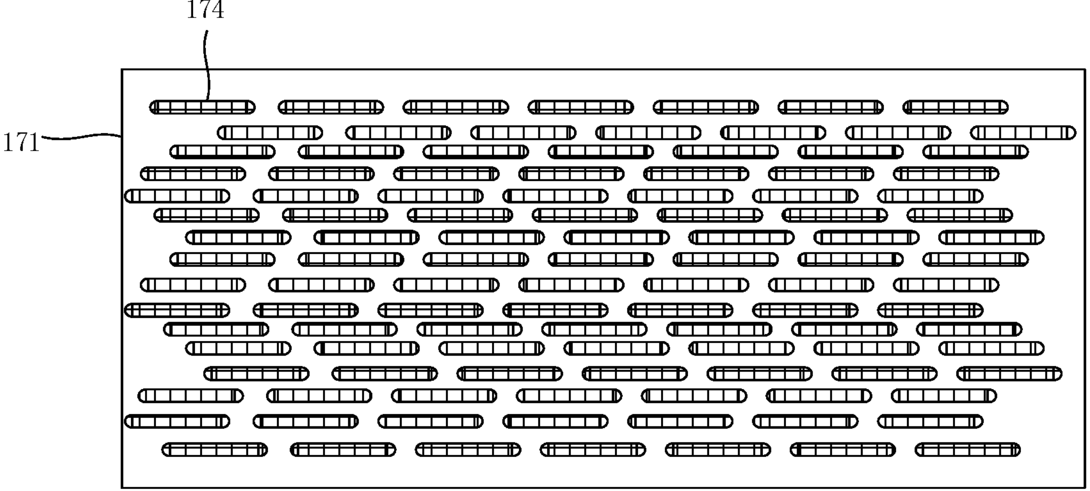
FIG. 2 is a schematic diagram of the first black matrix according to the present application.

FIG. 2 is a schematic diagram of a first black matrix according to this application. As shown in FIG. 2, the carbon black particles in the first black matrix 171 are carbon black filaments 174. The carbon black filaments 174 are each in the shape of a elongated strip. The sizes of the plurality of carbon black filaments 174 are substantially the same. In this embodiment, the carbon black particles are carbon black filaments 174. Typical carbon black particles are carbon black particles of different sizes and shapes, while in this embodiment, the carbon black particles are unified into carbon black filaments 174, so that the carbon black filaments 174 in the first black matrix 171 can be more uniform. In this solution, the carbon black filaments 174 in the first black matrix 171 are set to the same size, so that the ultrasonic wave passes through approximately the same number of carbon black filaments 174 at each position, and the resulting scattering and refraction losses are consistent. When the ultrasonic wave is reflected back from the finger into the piezoelectric material, the loss is consistent at every point, preventing the loss of ultrasonic wave during propagation from causing errors in fingerprint recognition.

Further, the carbon black filament 174 includes a first end and a second end in the length orientation. The first ends of the plurality of carbon black filaments 174 are oriented in the same direction, that is, the plurality of carbon black filaments 174 are arranged in the same orientation. After the carbon black filaments 174 in the first black matrix 171 are set to the same size and arranged in an orderly manner, the scattering and refractive loss of ultrasonic waves in the first black matrix 171 are smaller, and the scattering and refraction by the carbon black filaments 174 at each position are approximately the same, so that the propagation loss of the ultrasonic wave in the first black matrix 171 is smaller and the loss at each position is equal.

In another embodiment, the length orientation of the plurality of carbon black filaments 174 is consistent with the length orientation of the first black matrix 171.

The black matrix may mainly include dispersants, carbon black particles and organic solvents, etc. The main function of carbon black particles in the black matrix is to absorb light. This application uses electrospinning technology to prepare carbon black particles into carbon black filaments 174 with a length of 100-1000 nm and a diameter of 1-100 nm. By uniformly dispersing the carbon black filaments 174 in the solvent of the black matrix, and using an electric field or printing method, the carbon black filaments 174 are formed into a first black matrix 171 with uniformity at each position, consistent orientation and arrangement order, and uniform density. The carbon black filaments 174 produced by electrospinning technology have a comparatively larger specific surface area and can absorb visible light more effectively. Therefore, under the same light absorption characteristics, the amount of carbon black filaments 174 can be effectively reduced compared with the amount of granular carbon black.

In another embodiment, the first or second end of the carbon black filament 174 may be doped with a magnetic material. The magnetic material will lose its magnetism after a period of time. Before the first black matrix 171 is solidified, the carbon black filaments 174 may be evenly arranged through magnetic field control so that the first ends are oriented in the same direction.

Figure 3:
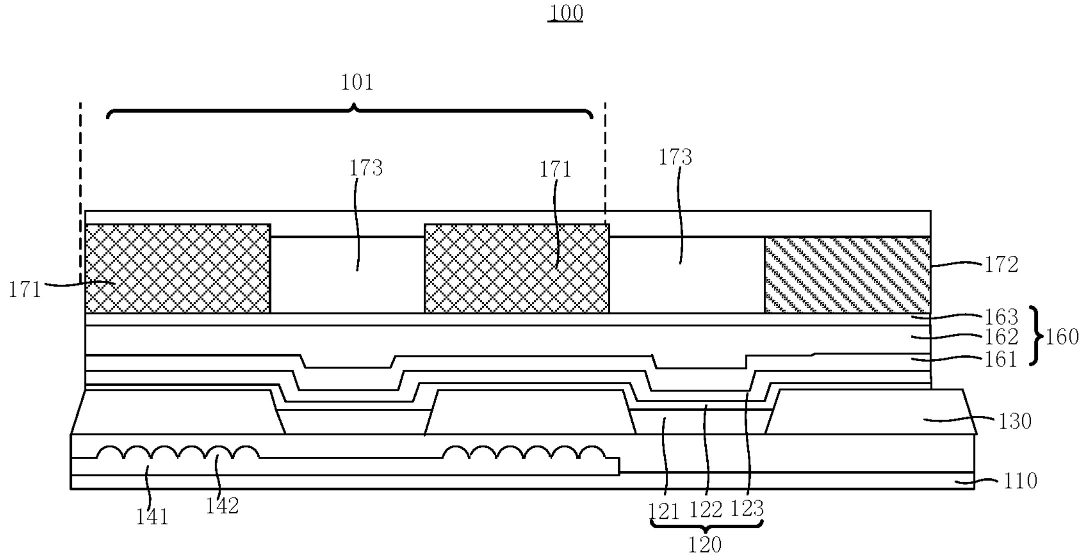
FIG. 3 is a schematic diagram of a second display panel according to the present application.

FIG. 3 is a schematic diagram of a second display panel according to this application. Referring to FIG. 3, this application discloses a display panel 100, including a substrate 110, a pixel defining layer 130, a light-emitting element 120, an encapsulation layer 160, a color filter layer 170, and a planarization layer 180. The pixel defining layer 130 and the light-emitting element 120 are disposed in the same layer. An opening area is disposed between two adjacent pixel defining layers 130. The pixel defining layer 130 is disposed corresponding to the non-opening area. The light-emitting element 120 is disposed in the opening area. Along the direction of getting farther away from the substrate 110, the light-emitting element 120 includes a bottom electrode 121, a light-emitting layer 122, and a top electrode 123 that are stacked in sequence. The encapsulation layer 160 is disposed on the pixel defining layer 130 and the light-emitting element 120. The encapsulation layer 160 may include at least three film layers, such as a first inorganic layer 161, a first organic layer 162, and a second inorganic layer 163. Alternatively, multiple layers including an inorganic layer, an organic layer, and an inorganic layer may be alternately arranged to realize the encapsulation of the light-emitting element 120. The planarization layer 180 is disposed on the color filter layer 170.

The color filter layer 170 is disposed on a light-emitting side of the light-emitting element 120. The color filter layer 170 includes a first black matrix 171, a second black matrix 172, and a color filter 173. The first black matrix 171 is arranged corresponding to the fingerprint recognition region 101. The adjacent color filters 173 are separated by the first black matrix 171 or the second black matrix 172. The first black matrix 171 and the second black matrix 172 each include carbon black particles. The carbon black particles arranged in the first black matrix 171 are arranged in a different order than the carbon black particles arranged in the second black matrix 172. The acoustic impedance of the first black matrix 171 to ultrasonic waves is lower than the acoustic impedance of the second black matrix 172 to ultrasonic waves.

The thickness of the planarization layer 180 corresponding to the first black matrix 171 is smaller than the thickness of the planarization layer 180 corresponding to the second black matrix 172. The thickness of the first black matrix 171 is greater than or equal to the thickness of the second black matrix 172.

In this solution, the planarization layer 180 is the position closest to the finger touch, and it is an organic film layer used for planarization. Because it is light-transmissive, its internal composition is simple and does not contain solid particles. Although there are no solid particles inside the planarization layer 180, its ultrasonic wave transmission efficiency is relatively weaker than that of the black matrix. Therefore, in this solution, by increasing the thickness of the first black matrix 171 and making the planarization layer of the fingerprint recognition region 101 thinner, the propagation of ultrasonic waves in the planarization layer 180 may be reduced and the propagation in the first black matrix 171 may be increased.

It can be understood that the actual area of the first black matrix 171 mentioned in this application may be larger than the area of the fingerprint recognition region 101. The purpose is to avoid the transition area between the first black matrix 171 and the second black matrix 172 from affecting fingerprint recognition. The first black matrix 171 is enlarged to ensure the ultrasonic recognition accuracy of the fingerprint recognition region 101, so that the first black matrix 171 can completely cover the fingerprint recognition region 101. Moreover, relatively speaking, the process and preparation are relatively simple.

Figure 4:
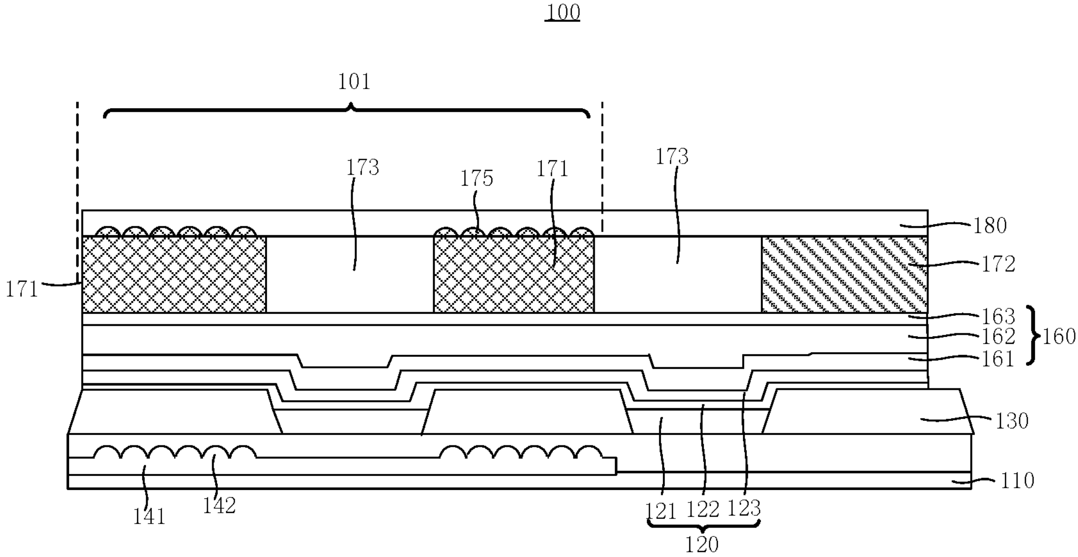
FIG. 4 is a schematic diagram of a third display panel according to the present application.

FIG. 4 is a schematic diagram of a third display panel according to this application. Referring to FIG. 4, this application discloses a display panel 100, including a substrate 110, a pixel defining layer 130, a light-emitting element 120, an encapsulation layer 160, a color filter layer 170, and a planarization layer 180. The above film layers are consistent with those of the above-mentioned second display panel 100 and are not to be detailed again herein.

Specifically, a plurality of protruding structures 175 are disposed on the first black matrix 171, and the plurality of protruding structures 175 are arranged in an array at preset intervals.

In this solution, the main consideration is that during the manufacturing process, the surface of the black matrix may appear uneven, so that when the ultrasonic wave passes through the surface of the uneven first black matrix 171, the losses at different positions are uneven so that there are many strong and weak contrasts, thus causing signal noises. Although they can be filtered out through noise filtering, it may cause the subsequent algorithm to become more complex and the data processing complexity to be higher. In this solution, a plurality of periodic and array-arranged protruding structures 175 are disposed on the surface of the first black matrix 171. The ultrasonic signal changes produced by these array-arranged protruding structures 175 are much greater than the signal changes caused by the uneven surface of the first black matrix 171, so that the signal changes caused by the uneven surface of the first black matrix 171 are weakened, which is used to weaken the error caused by the surface unevenness produced during the preparation of the black matrix itself. Moreover, because the ultrasonic signal changes produced by the array-arranged protruding structures 175 are regular and easy to filter out from the original ultrasonic signal, it can make the ultrasonic wave present a periodic strengthening effect, making it less likely to be lost when passing through the film layers.

Specifically, a shape of the projection of the protruding structure 175 on the substrate may be square, rectangular or circular, and the thickness of the protruding structure 175 may range from 1 um to 2 um. It can be understood that the thickness of the protruding structure 175 stated here refers to the height of the protruding structure 175 above the surface of the first black matrix 171. To calculate the thickness of the black matrix at the position where the protruding structure 175 is located, it is also needed to add the thickness of the black matrix at the non-protruding position.

In another embodiment, the thickness of the raised structure 175 is equal to 30% to 60% of the thickness of the planarization layer 180.

In this embodiment, multiple protruding structures 175 are designed on the first black matrix 171 of the fingerprint recognition region 101. The spacing period of the protruding structure 175 is equal to N times the pixel pitch, where N is a natural number greater than zero. Since the range of the ultrasonic sensor emitting ultrasonic waves is significantly larger than the fingerprint recognition region 101, the raised area in this proposal is slightly larger than the fingerprint recognition region 101. The purpose is to completely cover the fingerprint recognition region 101 to ensure the ultrasonic recognition accuracy of the fingerprint recognition region 101, and to form a contrast with the fingerprint recognition region 101 to increase the ultrasonic discrimination capability. Furthermore, the periodic protruding structures 175 are intended to make the enhancement effect of the ultrasonic wave show a periodic strengthening effect and to reduce the error caused by the surface unevenness during the preparation of the black matrix itself. Because if the black matrix itself is uneven during preparation, the loss of the entire plane of ultrasonic waves will be uneven, and there will be multiple of strength and weakness contrasts, similar to what is often called signal noise. However, when the first black matrix 171 is made into such a periodic protruding structure 175, the change in the ultrasonic signal produced by the protruding structure 175 will be much greater than the change caused by its own unevenness. This strengthening effect will weaken the signal noise, so the error caused by the signal noise will be weakened during signal processing.

Specifically, a fingerprint recognition element 140 is disposed on the substrate 110 corresponding to the fingerprint recognition region 101. The fingerprint recognition element 140 is disposed under the light-emitting element 120 and the pixel defining layer 130. The fingerprint recognition element 140 includes a piezoelectric material layer 141. The piezoelectric material layer 141 is correspondingly disposed below the first black matrix 171. Moreover, the piezoelectric material layer 141 includes convex portions 142 corresponding to the protruding structures 175 of the first black matrix 171. The convex portions 142 is disposed in one-to-one correspondence with the protruding structures 175. In this scheme, the first black matrix 171 is grid-shaped in top view. Correspondingly, the piezoelectric material includes convex portions 142 at locations corresponding to the first black matrix 171, and the convex portions 142 are consistent with the protruding structures 175. This further increases the amount of signal reflected from the fingerprint, thereby improving contrast and the signal-to-noise ratio.

The material of the piezoelectric material layer 141 may include, but is not limited to, polyvinylidene fluoride, polytrifluoroethylene, polyvinyl chloride, polycarbonate, polyvinylidene fluoride, polymethacrylate, methyl acrylate, polytetrafluoroethylene, piezoelectric ceramics, or piezoelectric crystals, etc.

Figure 5:
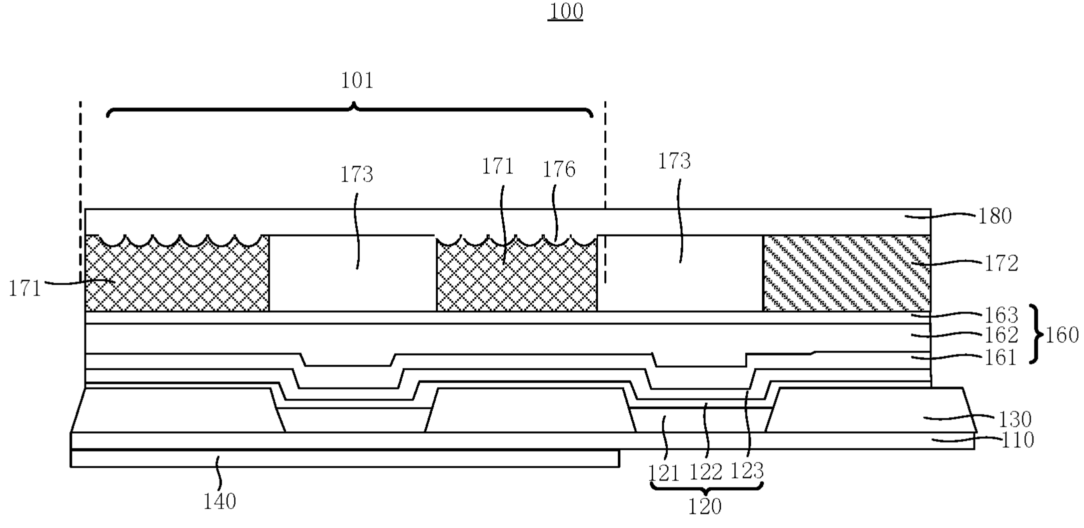
FIG. 5 is a schematic diagram of a fourth display panel according to the present application.

FIG. 5 is a schematic diagram of a fourth display panel of this application. Referring to FIG. 5, this application discloses a display panel 100, including a substrate 110, a pixel defining layer 130, a light-emitting element 120, an encapsulation layer 160, a color filter layer 170, and a planarization layer 180. The above film layers are consistent with those of the above-mentioned second display panel 100 and are not to be detailed again herein. Specifically, a plurality of pit structures 176 are disposed in the first black matrix 171, and the plurality of pit structures 176 have the same shape and size. The plurality of the pit structures 176 are arranged in an array at predetermined intervals. A radial width of the pit structure 176 ranges from 1 mm to 10 mm. Relatively speaking, the groove solution is easier to implement in terms of the manufacturing process, and it can be achieved through a halftone masking process, and the cost is lower.

Figure 6:
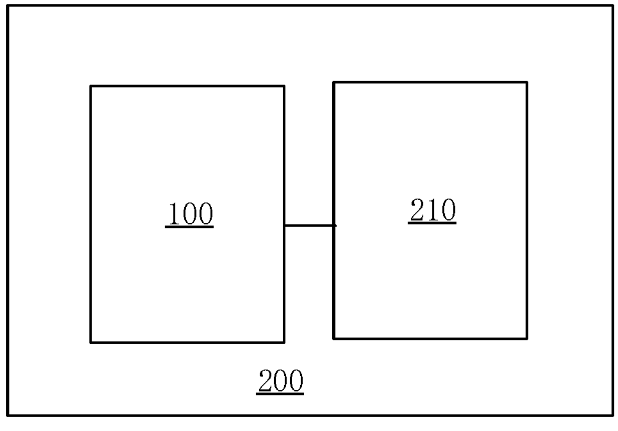
FIG. 6 is a schematic diagram of a display device according to this application.

FIG. 6 is a schematic diagram of a display device according to this application. Referring to FIG. 6, this application discloses a display device. The display device 200 includes a driving circuit 210 and the display panel 100 in any of the above embodiments, where the driving circuit 210 is used to drive the display panel 100 to display.

In this application, by improving the arrangement order of carbon black particles in the first black matrix, when the ultrasonic wave passes through the first black matrix, the scattering and refraction interfaces can be effectively reduced, and at the same time, the variation range of the scattering and refraction angles is smaller so that and there is less interference with the normal propagation of longitudinal waves. Accordingly, the loss of ultrasonic waves after passing through the BM will also be effectively reduced. Thus, the acoustic impedance of the first black matrix to ultrasonic waves is lower than the acoustic impedance of the second black matrix to ultrasonic waves, so that in the fingerprint recognition region, the loss caused by the first black matrix to ultrasonic waves is lower, reducing the wave intensity loss after scattering and refraction of the ultrasonic waves in the fingerprint recognition region, thereby increasing the accuracy of fingerprint recognition.

It should be noted that the inventive concept of this application can be formed into many embodiments, but the length of the application document is limited and so these embodiments cannot be enumerated one by one. The technical features can be arbitrarily combined to form a new embodiment, and the original technical effect may be enhanced after the various embodiments or technical features are combined.

The foregoing is merely a further detailed description of this application made with reference to some specific illustrative embodiments, but the specific implementations of this application are not to be construed to be limited to these illustrative embodiments. For those having ordinary skill in the technical field to which this application pertains, numerous deductions or substitutions may be made without departing from the concept of this application, which shall all be regarded as falling in the scope of protection of this application.

What is claimed is:

1. A display panel, comprising a display area, the display area comprising a fingerprint recognition region; wherein there is disposed a fingerprint recognition element in the display panel correspondingly below the fingerprint recognition region;

wherein the display panel further comprises a plurality of light-emitting elements and a color filter layer disposed on a light-emitting side of the plurality of light-emitting elements;

wherein the color filter layer comprises a first black matrix and a color filter, the first black matrix being disposed corresponding to the fingerprint recognition region, and wherein adjacent color filters are separated by the first black matrix;

wherein the first black matrix comprises a plurality of carbon black filaments, each of which is of a strip shape; wherein the plurality of carbon black filaments each have a length that lies in the range of 100 nm to 1000 nm and a diameter that lies in the range of 1 nm to 100 nm.

2. The display panel as recited in claim 1, wherein the plurality of carbon black filaments have an equal size.

3. The display panel as recited in claim 1, wherein each carbon black filament comprises a first end and a second end along a length of the carbon black filament, and wherein the first end of each of the plurality of carbon black filaments is disposed in an identical orientation.

4. The display panel as recited in claim 1, further comprising a planarization layer disposed on the color filter layer, wherein the color filter layer further comprises a second black matrix, and wherein adjacent color filters are separated by the first black matrix or the second black matrix; wherein a thickness of a portion of the planarization layer corresponding to the first black matrix is smaller than a thickness of a portion of the planarization layer corresponding to the second black matrix;

wherein the first black matrix has a thickness that is greater than or equal to a thickness of the second black matrix.

5. The display panel as recited in claim 1, wherein the first black matrix comprises a plurality of protruding structures or pit structures, and wherein the plurality of protruding structures or pit structures have an identical shape and size;

wherein the plurality of protruding structures or pit structures are arranged in an array at predetermined intervals, and wherein the plurality of protruding structures or pit structures each have a radial width that lies in the range from 1 mm to 10 mm.

6. The display panel as recited in claim 5, wherein the first black matrix comprises a plurality of protruding structures, wherein a planarization layer is disposed on the color filter layer, and wherein a thickness of each of the plurality of protruding structures is equal to 30% to 60% of a thickness of the planarization layer.

7. The display panel as recited in claim 6, wherein the fingerprint recognition element comprises a piezoelectric material layer correspondingly disposed below the respective first black matrix, wherein the piezoelectric material layer comprises a plurality of convex portions corresponding to the plurality of protruding structures of the first black matrix, and wherein the plurality of convex portions are disposed in one-to-one correspondence with the plurality of protruding structures.

8. The display panel as recited in claim 1, wherein a length orientation of each of the plurality of carbon black filaments is consistent with a length orientation of the respective first black matrix.

9. The display panel as recited in claim 1, wherein the color filter layer further comprises a second black matrix, the second black matrix comprising a plurality of carbon black particles; wherein the plurality of carbon black particles disposed in the first black matrix are arranged in a different order than the plurality of carbon black particles disposed in the second black matrix; wherein an acoustic impedance of the first black matrix to ultrasonic waves is lower than an acoustic impedance of the second black matrix to ultrasonic waves.

10. The display panel as recited in claim 1, further comprising a substrate, a plurality of pixel defining layers, and an encapsulation layer; wherein an opening area is disposed between every two adjacent pixel defining layers; wherein the light-emitting element is arranged in the respective opening area, and wherein the light-emitting element comprises a bottom electrode, a light-emitting layer, and a top electrode that are stacked in sequence in a direction of getting farther away from the substrate; wherein an encapsulation layer is disposed on the plurality of pixel defining layers and the plurality of light-emitting elements.

11. A display device, comprising a driving circuit and a display panel, the driving circuit being used to drive the display panel to display; wherein the display panel comprises a display area, the display area comprising a fingerprint recognition region, wherein there is disposed a fingerprint recognition element in the display panel correspondingly below the fingerprint recognition region; wherein the display panel further comprises a plurality of light-emitting elements and a color filter layer disposed on a light-emitting side of the plurality of light-emitting elements;

wherein the color filter layer comprises a first black matrix and a color filter, the first black matrix being disposed corresponding to the fingerprint recognition region, and wherein adjacent color filters are separated by the first black matrix;

wherein the first black matrix comprises a plurality of carbon black filaments, each of which is of a strip shape; wherein the plurality of carbon black filaments each have a length that lies in the range of 100 nm to 1000 nm and a diameter that lies in the range of 1 nm to 100 nm.

12. The display device as recited in claim 11, wherein the plurality of carbon black filaments have an equal size.

13. The display device as recited in claim 11, wherein each carbon black filament comprises a first end and a second end along a length of the carbon black filament, and wherein the first end of each of the plurality of carbon black filaments is disposed in an identical orientation.

14. The display device as recited in claim 11, wherein further comprising a planarization layer disposed on the color filter layer, wherein the color filter layer further comprises a second black matrix, and wherein adjacent color filters are separated by the first black matrix or the second black matrix; wherein a thickness of a portion of the planarization layer corresponding to the first black matrix is smaller than a thickness of a portion of the planarization layer corresponding to the second black matrix;

wherein the first black matrix has a thickness that is greater than or equal to a thickness of the second black matrix.

15. The display device as recited in claim 11, wherein the first black matrix comprises a plurality of protruding structures or pit structures, and wherein the plurality of protruding structures or pit structures have an identical shape and size;

wherein the plurality of protruding structures or pit structures are arranged in an array at predetermined intervals, and wherein the plurality of protruding structures or pit structures each have a radial width that lies in the range from 1 mm to 10 mm.

16. The display device as recited in claim 15, wherein the first black matrix comprises a plurality of protruding structures, wherein a planarization layer is disposed on the color filter layer, and wherein a thickness of each of the plurality of protruding structures is equal to 30% to 60% of a thickness of the planarization layer.

17. The display device as recited in claim 16, wherein the fingerprint recognition element comprises a piezoelectric material layer correspondingly disposed below the respective first black matrix, wherein the piezoelectric material layer comprises a plurality of convex portions corresponding to the plurality of protruding structures of the first black matrix, and wherein the plurality of convex portions are disposed in one-to-one correspondence with the plurality of protruding structures.

18. The display device as recited in claim 11, wherein a length orientation of each of the plurality of carbon black filaments is consistent with a length orientation of the respective first black matrix.

* * * * *